United States Patent
Lee et al.

(10) Patent No.: US 6,300,238 B1
(45) Date of Patent: *Oct. 9, 2001

(54) METHOD OF FABRICATING NODE CONTACT OPENING

(75) Inventors: Tong-Hsin Lee; Terry Chung-Yi Chen, both of Taipei Hsien (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/390,104

(22) Filed: Sep. 3, 1999

(51) Int. Cl.[7] ................................................. H01L 21/8242
(52) U.S. Cl. ........................... 438/624; 438/639; 438/700
(58) Field of Search ..................................... 438/624, 253, 438/639, 700, FOR 118, FOR 212, FOR 355, 945

(56) References Cited

U.S. PATENT DOCUMENTS 5,933,755 * 8/1999 Lee .
6,033,980 * 3/2000 Liou et al. .
6,087,216 * 7/2000 Wang .
6,090,663 * 7/2000 Wu .

* cited by examiner

Primary Examiner—George Fourson
Assistant Examiner—Joannie Adelle Garcia
(74) Attorney, Agent, or Firm—Thomas, Kayden, Horstemeyer & Risley, LLP

(57) ABSTRACT

A fabrication method of a node contact opening involves forming a first insulating layer on the substrate, in which a bit line, which contacts the substrate, is formed on the first insulating layer. A conformal second insulating layer that serves as an etching stop layer is formed after the formation of bit line. A third insulating layer is then formed to isolate the subsequently formed capacitor and bit line. A pattern mask is formed on the third insulating layer, while a pattern of the pattern mask is transferred into the third insulating layer, so that an opening is formed in the third insulating layer. After the second insulating layer in the opening is removed, a spacer is formed on a sidewall of the opening. With the pattern mask and the spacer serving as an etching mask, the first insulating layer below the bit line is etched until the opening is extended through to the substrate, so that a contact opening is formed.

8 Claims, 4 Drawing Sheets

METHOD OF FABRICATING NODE CONTACT OPENING

BACKGROUND OF THE INVENTION

1. Field of Invention

The present invention relates to an integrated circuit (IC) process. More particularly, the present invention relates to a method for fabricating a node contact opening.

2. Description of Related Art

Conventionally, in the IC process for dynamic random access memory (DRAM), an oxide layer is deposited after the formation of the metal oxide semiconductor (MOS). A bit line, which couples electrically with the substrate, is formed on the oxide layer before performing the capacitor process. A further oxide layer is deposited on the bit line and partially removed by photolithography and etching to form a node contact opening. As the node contact opening is etched for a longer duration due to its higher aspect ratio, a thicker pattern photoresist is required to adequately reduce the pattern distortion, which occurs during the long etching process. However, the thicker pattern photoresist has inevitably caused the problem of poorer focus window.

As the device size becomes smaller, the bit line is also easily exposed during the etching for the node contact opening, so that a short-circuiting occurs between the subsequently formed capacitor and the bit line. Although a silicon nitride spacer is formed on the sidewall of the opening, the substrate may still be exposed in the etching environment during the etching step for forming the silicon nitride spacer. This increases the possibility of the single cell substrate being damaged, thus influencing the reliability of the device.

SUMMARY OF THE INVENTION

The invention provides a method for fabricating a node contact opening. A thinner pattern photoresist is used to improve the focus window of the photoresist in the photolithography.

The method provided in the present invention prevents not only the short-circuiting between the capacitor and the bit line, but also protects the substrate exposed by the node contact opening from more damage.

As embodied and broadly described herein, the invention provides a fabrication method for a node contact, which method involves forming an insulating layer on the substrate, while a bit line which contacts the substrate is formed on the insulating layer. A conformal second insulating layer that serves as an etching stop layer is formed to cover the bit line and the first insulating layer. A third insulating layer is then formed on the second insulating layer to isolate the subsequently formed capacitor and bit line. A pattern mask is formed on the third insulating layer, while the pattern of the mask is transferred into the third insulating layer for subsequent etching, so that an opening is formed in the third insulating layer. After the second insulating layer in the opening is removed, a spacer is formed on a sidewall of the opening. With the pattern mask and the spacer serving as an etching mask, the first insulating layer below the bit line is etched until the opening is extended through to the substrate, so that a contact opening which connects the capacitor and the substrate is formed.

The photoresist is used together with the pattern mask during the formation of the node contact opening, so a thinner pattern photoresist is patterned to improve the focus window of the photoresist in the etching process. Since the spacer is formed on the sidewall of the opening during the first stage etching for the node contact opening, the spacer can also serve as an electrical isolation while the size of the node contact opening in the substrate is further reduced. This is the case even when the bit line is exposed during the formation of the opening. Furthermore, the substrate is protected from more damage because the spacer is not formed after the formation of the node contact opening.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 1A to 1E are schematic, cross-sectional diagrams illustrating the process flow for fabricating a node contact opening according the invention. FIGS. 2A to 2E are cross-sectional diagrams taken at a right angle to the first cross-sectional diagrams and bisecting at line II—II in FIGS. 1A to 1E.

Figure 1A:
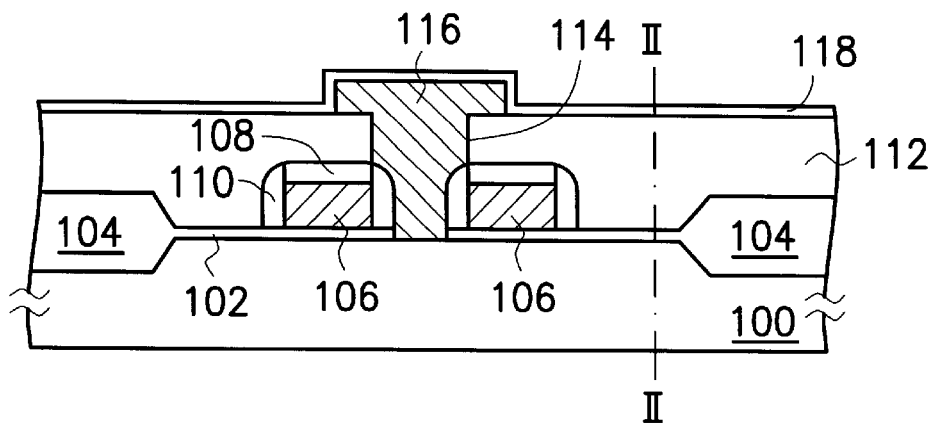
FIGS. 1A to 1E are schematic, cross-sectional diagrams illustrating the process flow for fabricating a node contact opening according the invention.
Figure 2A:
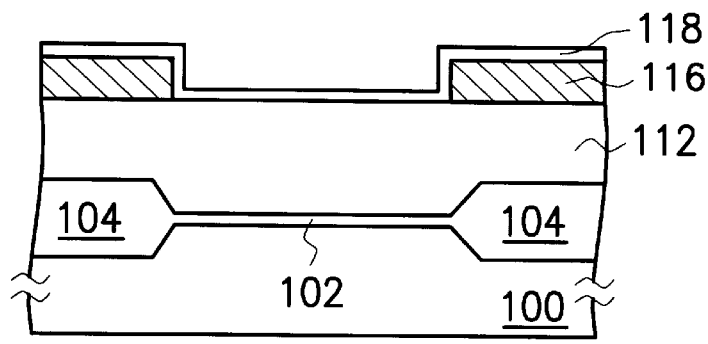
FIGS. 2A to 2E are cross-sectional diagrams taken at a right angle to the first cross-sectional diagrams and bisecting at line II—II in FIGS. 1A to 1E.

Referring to FIG. 1A and FIG. 2A, a substrate is provided with a device isolation structure, such as a field oxide layer 104, formed therein to define an active region of the device. The field effect transistor (FET) comprises a gate electrode 106, a gate oxide layer 102, and a source/drain (S/D) region (not shown), wherein the S/D region is located at both sides of the gate electrode 106 in the substrate 100. The gate electrode 106 is covered by the capping layer 108 and the spacer 110, so that the short-circuiting between the conducting material that fills the contact opening and the gate electrode 106 during the subsequent formation of the contact opening is prevented. The capping layer and the spacer in this case may include silicon nitride.

Furthermore, an insulating layer 112 is formed to cover the FET, wherein the material may include silicon oxide, while a contact opening 114 is formed in the insulating layer 112. A conducting wire which serves as a bit line 116 is formed on the insulating layer 112 to fill the contact opening 114 while contacting with the S/D region in the substrate 100.

A conformal insulating layer 118 which serves as an etching stop layer is then formed to cover the insulating layer 112 and the bit line 116, wherein the insulating layer 118 has a different etching selectivity from the insulating layer 112. The insulating layer 118 may include silicon nitride having a preferred thickness of about 300–500 Å.

Figure 1B:
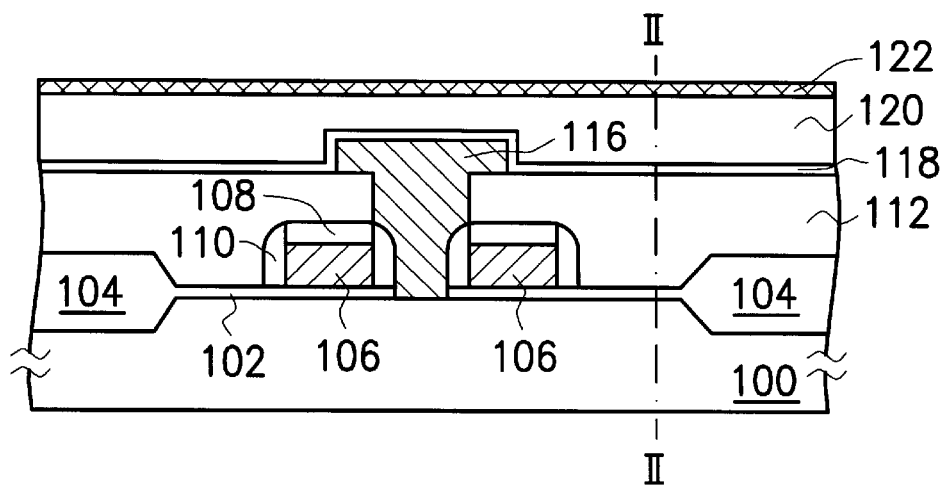
Figure 2B:
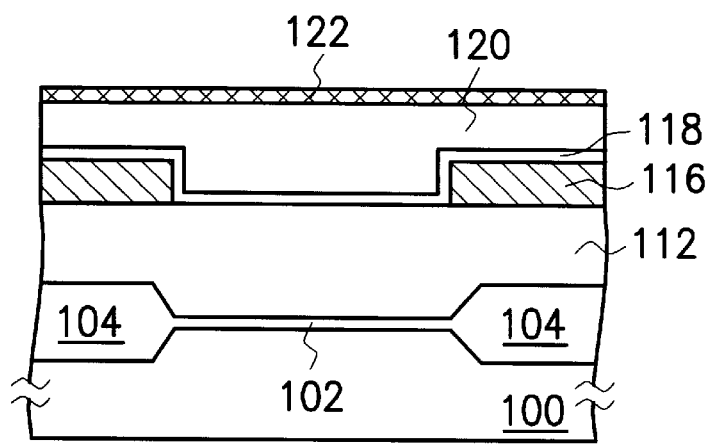

Referring simultaneously to FIG. 1B and FIG. 2B, an insulating layer 120 undergoing planarization is formed on the insulating layer 118, wherein the insulating layer 120 may include silicon oxide. A material layer 122 is then formed on the insulating layer 120, wherein the material layer 122 has different etching rate from the insulating layers 120, 118, and 112. The material layer 122 may include polysilicon having a preferred thickness of about 500–1000 Å.

Figure 1C:
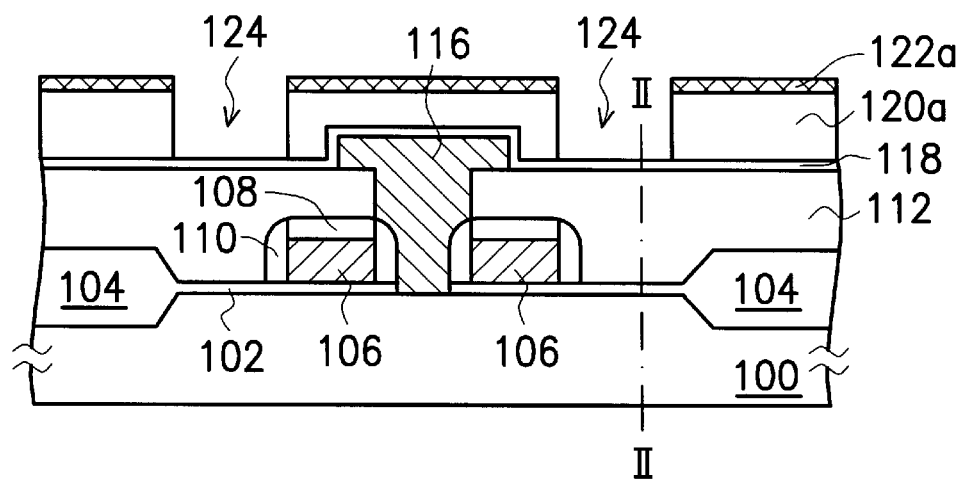
Figure 2C:
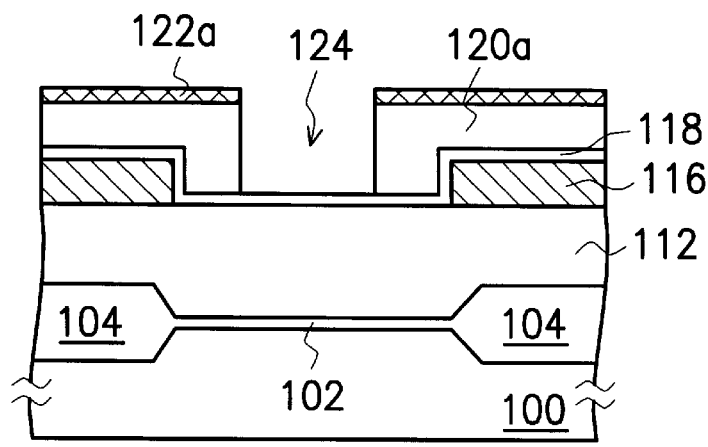

Reference is made to both FIG. 1C and FIG. 2C, in which the material layer 122 is patterned to form a pattern mask 122a. The method involves conventional photolithography and etching using a photoresist, which serves as an etching mask in the subsequent formation of the node contact opening. The pattern of the pattern mask 122a is transferred to the insulating layer 120 for forming an opening 124 in the insulating layer 120, while the insulating layer 120 becomes the insulating layer 120a. The step for transferring the pattern involves performing an etching process, with the pattern mask 122a serving as an etching mask and the insulating layer 118 serving as an etching stop layer.

According to the present invention, the etching process of the node contact opening is performed in separate stages. As the first stage etching described above has a shorter duration, the photoresist can be made thinner; thus the focus window of the photoresist in the photolithography is improved.

Figure 1D:
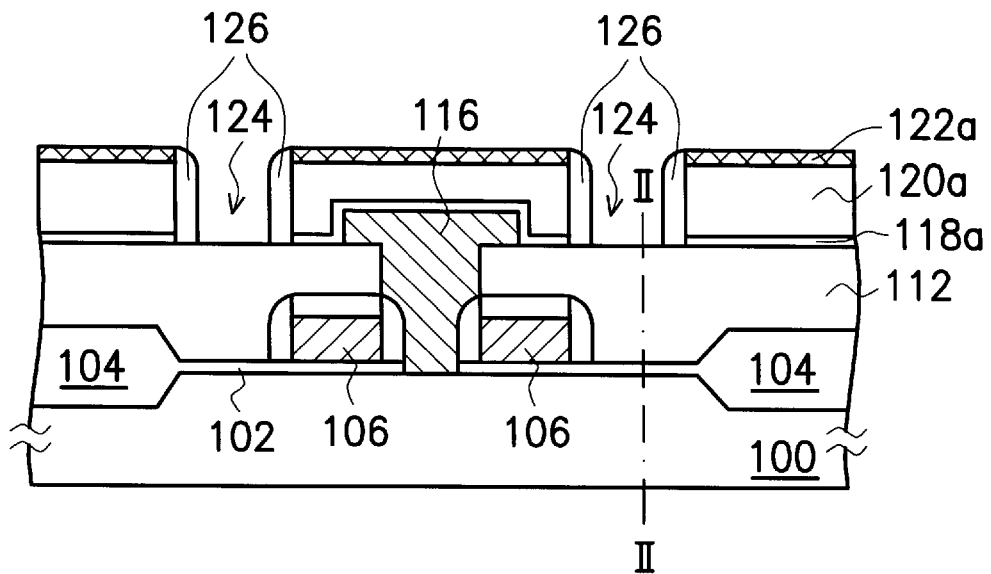
Figure 2D:
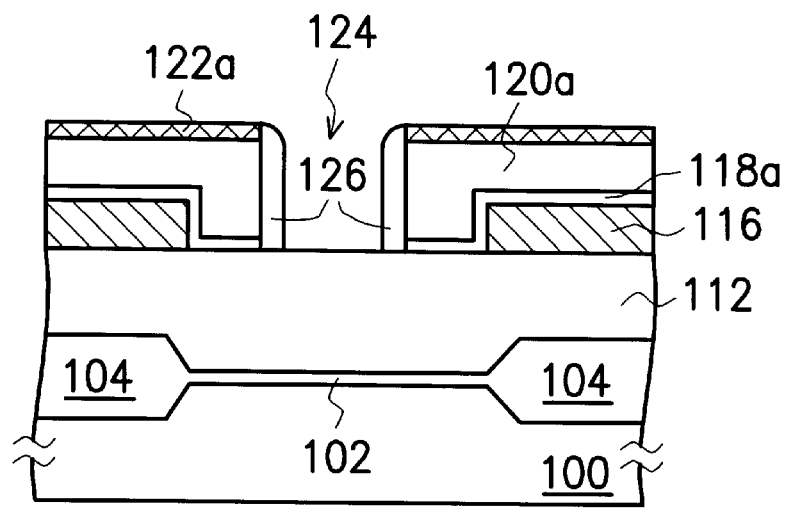

Referring to FIG. 1D and FIG. 2D, the insulating layer 118 in the opening 124 is removed until the insulating layer 112 below the insulating layer 118 is exposed, while the insulating layer 118 becomes the insulating layer 118a. A spacer 126 is formed on the sidewall of the pattern mask 122a and the insulating layers 120a, 118a, wherein the spacer 126 may include silicon nitride. The method for forming the spacer 126 may involve forming a silicon nitride layer having a preferred thickness of about 100–200 Å on the whole substrate 100, followed by etching back the silicon nitride layer.

Since the spacer 126 is formed on the sidewall of the opening 124, the spacer 126 made from a insulating material can still serve as an electrical isolation between the subsequently formed capacitor and the bit line 116. This is the case even though the bit line 116 is exposed as a result of misalignment during the etching of the opening 124.

The second stage etching for the node contact opening is described with reference to the accompanying diagrams as follow.

Figure 1E:
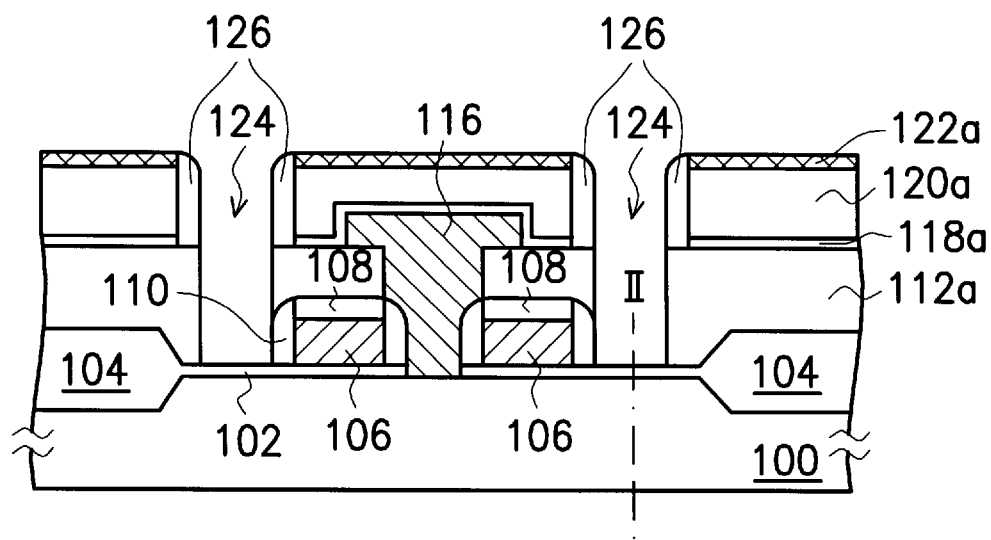
Figure 2E:
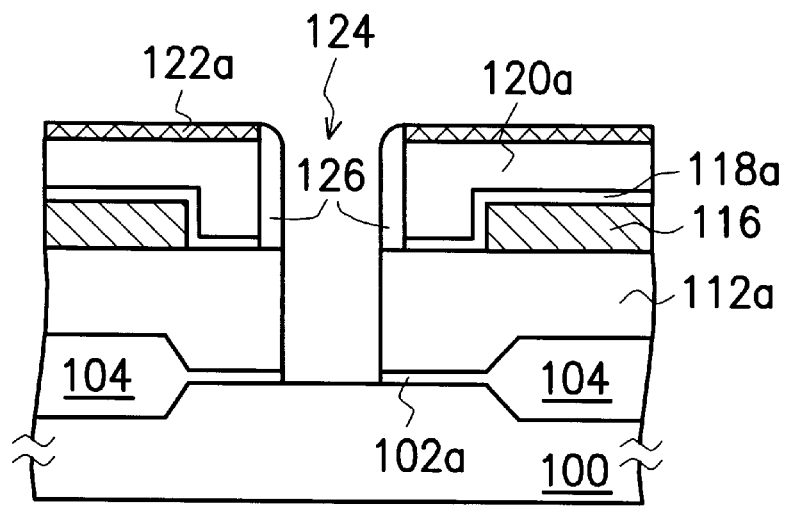

Referring to FIG. 1E and FIG. 2E, an anisotropic etching step is performed to extend the opening 124 through to the insulating layer 112 until the gate oxide layer 102 is exposed, with the pattern mask 122a and the spacer 126 serving as a hard mask, i.e. etching mask. In this case, the insulating layer 112 becomes the insulating layer 112a. The gate oxide layer 102 in the opening 124 is then removed until the substrate 100 is exposed, so that a node contact opening 124 is formed, while the gate oxide layer 102 becomes the gate oxide layer 102a shown in the diagram.

It is important to note that the photolithography and etching adopted for the node contact opening 124 has a size limitation instead of unlimited size reduction. However, such a size limitation is overcome by using the spacer 126. As a result, the node contact opening 124 formed in the substrate 100 conforms to the size defined by the design rule.

Summarizing the above, the invention has the following advantages. A thinner photoresist pattern is used to improve the focus window of the photoresist in the photolithography. In addition, the method provided by the invention prevents not only short-circuiting between the capacitor and the bit line, but also protects the substrate exposed by the node contact opening from further damage.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a node contact opening which electrically couples a capacitor and a substrate, the method comprising the steps of:

forming a first insulating layer on the substrate, wherein a bit line which contacts the substrate is formed on the first insulating layer;

forming a conformal second insulating layer which covers the bit line and the first insulating layer; wherein the second insulating layer and the first insulating layer have different etching rates;

forming a third insulating layer on the second insulating layer;

forming a pattern mask on the third insulating layer, wherein the pattern mask has a thickness of about 100–200 Å;

performing an etching step, wherein a pattern of the pattern mask is transferred into the third insulating layer, with the second insulating layer serving as an etching stop layer, so that an opening is formed in the third insulating layer;

removing the second insulating layer in the opening with the pattern mask serving as an etching mask;

forming a spacer on a sidewall of the opening; and etching the first insulating layer, with the pattern mask and the spacer serving as etching masks, so that the opening is extended to expose the substrate to form a node contact opening.

2. The method of claim 1, wherein the first insulating layer and the third insulating layer include silicon oxide, the second insulating layer includes silicon nitride, and the spacer includes silicon nitride.

3. The method of claim 1, wherein the pattern mask includes polysilicon.

4. The method of claim 1, wherein the second insulating layer has a thickness of about 300–500 Å.

5. A fabrication method for a node contact opening which electrically couples a capacitor and a substrate, the method comprising the steps of:

providing a substrate, wherein a first insulating layer is formed on the substrate, while a bit line which contacts the substrate is formed on the first insulating layer;

forming a conformal second insulating layer to cover the bit line and the first insulating layer;

forming a third insulating layer on the second insulating layer;

forming a pattern mask layer on the third insulating layer, wherein the pattern mask has a thickness of about 100–200 Å;

transferring a pattern of the pattern mask into the third insulating layer, so that an opening is formed in the third insulating layer;

removing the second insulating layer in the opening with pattern mask serving as an etching mask;

forming a spacer on a sidewall of the opening; and etching the first insulating layer, extending the opening to expose the substrate, with the pattern mask and the spacer serving as etching masks, so that a node contact opening is formed.

6. The method of claim 5, wherein the first insulating layer and the third insulating layer include silicon oxide, the second insulating layer includes silicon nitride, and the spacer includes silicon nitride.

7. The method of claim 5, wherein the pattern mask includes polysilicon.

8. The method of claim 5, wherein the second insulating layer has a thickness of about 300–500 Å.

* * * * *